Jan. 25, 1966 C. B. KNUDSON 3,231,787

SEMICONDUCTOR TIME DELAY SWITCH CONTROLLED BY VARIABLE RESISTANCE AND HAVING STABILIZATION MEANS

Filed April 11, 1963

CLARENCE B. KNUDSON
*INVENTOR.*

BY [signature]

ATTORNEY.

United States Patent Office 3,231,787
Patented Jan. 25, 1966

3,231,787
SEMICONDUCTOR TIME DELAY SWITCH CONTROLLED BY VARIABLE RESISTANCE AND HAVING STABILIZATION MEANS

Clarence B. Knudson, Inglewood, Calif., assignor to Hughey & Phillips, Inc., a corporation of California Filed Apr. 11, 1963, Ser. No. 272,391
11 Claims. (Cl. 317—148.5)

Figures 1, 2:
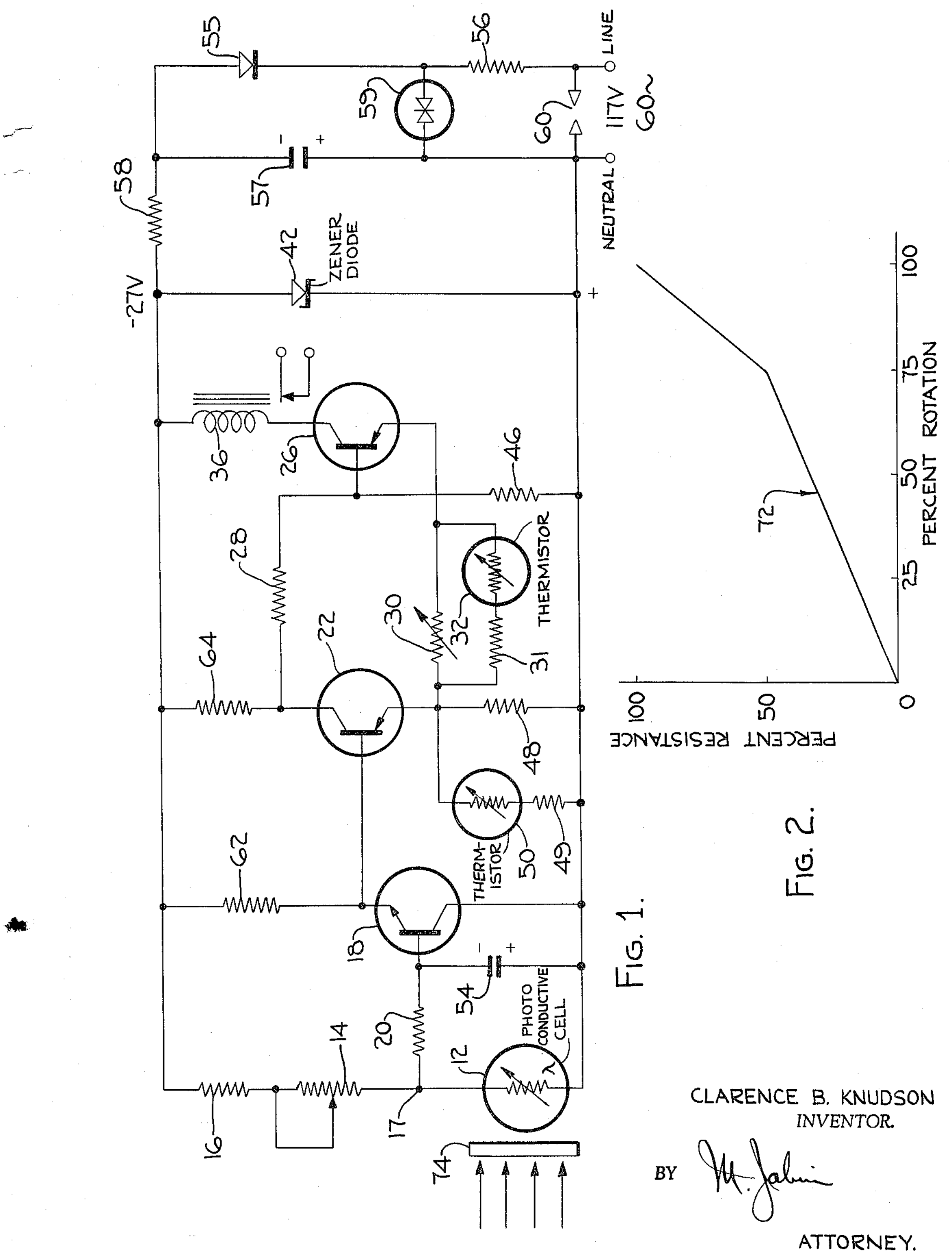

The present invention relates to semiconductor switching devices, and more particularly to semiconductor switching devices which utilize variable resistance control means.

One of the difficulties encountered with conventional semiconductor or solid-state switching devices is their susceptibility to variations of transistor Beta when the switch is used for D.C. level sensing. Another disadvantage is the variation in the transistor Beta versus ambient temperature characteristics.

It is an object of the present invention, therefore, to provide a novel semiconductor switch having a substantial reduction in its susceptibility to variations of transistor Beta when used for D.C. level sensing.

It is another object of the present invention to provide a simple semiconductor switch having a substantial reduction in variations in the transistor Beta versus ambient temperature characteristics.

It is another object of the present invention to provide a semiconductor switch in which the drift of the operating points is considerably reduced.

It is still another object of the present invention to provide a semiconductor switch which has high input impedance.

According to one embodiment of the present invention, a semiconductor switch utilizes complementary transistors coupled to a variable resistance control means in its input stage. The control means can be any variable resistance element such as a photoconductive cell, potentiometer, pressure gauge, strain gauge, thermistor, or the like.

The switch can be used to operate a relay, power transistor, controlled rectifier, magnetic amplifier, saturable reactor or the like.

The features of the present invention which are believed to be novel are set forth with particularity in the appended claims. The present invention, both as to its organization and manner of operation, together with further objects and advantages thereof, may be best understood by reference to the following description, taken in connection with the accompanying drawings, in which:

FIGURE 1 is a schematic diagram of a circuit according to the present invention, and FIGURE 2 is a graph of percent resistance versus percent rotation for a potentiometer used in the circuit of FIGURE 1.

Turning now to the drawings, FIGURE 1 shows photoconductive cell 12 connected in series with potentiometer 14 and resistor 16. Junction 17 between cell 12 and potentiometer 14 is connected to the base of NPN transistor 18 through resistor 20. The emitter of transistor 18 is connected to the base of PNP transistor 22. The collector of transistor 22 is connected to the base of PNP transistor 26 through resistor 28. The emitters of transistors 22 and 26 are coupled together through the parallel network of resistor 30, resistor 31 and thermistor 32. The collector of transistor 26 is connected to the negative side of a 27 volt D.C. supply through the coil of relay 36.

The negative side of the 27 volt D.C. supply is also coupled to the anode of Zener diode 42, to the collector of transistor 22, to the emitter of transistor 18, and to resistor 16. The cathode of Zener diode 42 is connected to the positive side of the 27 volt D.C. supply, which is also coupled to the base of transistor 26 through resistor 46, to the emitter of transistor 22 through the parallel network of resistor 48, resistor 49 and thermistor 50, to the collector of transistor 18, to the base of transistor 18 through capacitor 54, and to photoconductive cell 12.

The 27 volt D.C. supply is provided by the half wave rectifying action of diode 55 connected to the A.C. input line through resistor 56, which limits the voltage applied to diode 55. The polarity of the rectified output of diode 55 is such that the neutral side of the A.C. input becomes the positive side of the 27 volt D.C. supply. Capacitor 57 and resistor 58 filter the half-wave rectified output of diode 55. Surge-limiting double-anode diode 59 and spark gap 60 provide protection against high voltage transients which may appear on the A.C. input. The operation of the circuit shown in FIGURE 1 will now be described.

Resistor 16, potentiometer 14 and control means photoconductive cell 12 form a voltage divider across the 27 volt D.C. power supply. The voltage at junction 17 will be determined by the ratio between the resistance of the control means and the combined resistance of potentiometer 14 and resistor 16. Potentiometer 14 is provided in order to be able to adjust the divider ratio to suit the operating range of the control means. A potentiometer with a special curve to provide a desired function, as for the light operated device to be described herein, may be utilized instead of a standard type.

Variation of the resistance of the control means causes the circuit to be in one or the other of two stable states, so that the collector load of transistor 26 is either energized or not energized. When the circuit is arranged as shown in FIGURE 1 a decrease in the control means resistance to a critical value causes power to be switched into the collector load of transistor 26. Conversely, an increase in the resistance of the control means to a higher critical value causes the collector load power of transistor 26 to be switched off.

For convenience, a starting condition will be assumed for which the control means resistance is higher than the value necessary to switch to the transistor 26 collector load de-energized state. Under this condition, transistor 18 current will be fairly low, transistor 22 current will be high, and transistor 26 will be completely cut off.

Referring to FIGURE 1 it will be seen that resistor 62 and the collector impedance of transistor 18 form a divider network directly connected to the base of transistor 22. A change in the emitter current of transistor 18 produces a change in the emitter current of transistor 22. Now consider a condition for which the resistance of the control means 12 decreases progressively. This action increases the base input voltage of transistor 18 (i.e., the drop across potentiometer 14 and resistor 16), and as a consequence the emitter current of transistor 18 rises. This in turn produces a higher voltage drop across resistor 62, and consequently the base input voltage of transistor 22 becomes lower (i.e., the drop across the collector impedance of transistor 18), which reduces the emitter current of transistor 22. Thus, the voltage drops across resistor 64 in the collector circuit of transistor 22 and the resistance network in the emitter circuit of transistor 22 are reduced. The emitter of transistor 26 is connected to the emitter of transistor 22 by means of a resistance network, so that the emitter voltage of transistor 26 also decreases.

The transistor 22 collector resistor 64 is part of a divider network consisting or resistors 64, 28 and 46 in the base circuit of transistor 26. The decreasing voltage drop across resistor 64 causes the base input voltage of transistor 26 to rise slightly (i.e., the drop across resistor 46). Under the initial starting condition the voltage across resistor 46 is less than the voltage across the emitter circuit network of transistor 22, so that transistor 26 is reversely biased, which maintains the cut-off condition of transistor 26. The above process continues as the control means resistance is further reduced, until a critical point is reached where transistor 26 becomes forward biased and a regenerative action takes place, which drives transistor 26 rapidly into saturation, thereby energizing the collector load of transistor 26. The circuit will maintain this condition of operation until the control means resistance is increased to the point where turn-off takes place, as will now be described.

Consider the reverse of the above operation, or the condition for which the control means resistance is gradually increasing from some low value which has maintained transistor 26 turned on. The increasing control means resistance causes the base input voltage of transistor 18 to be reduced (i.e., the drop across potentiometer 14 and resistor 16), which in turn reduces the emitter current of transistor 18 flowing through resistor 62. This process lowers the voltage drop across resistor 62, and consequently the base input voltage of transistor 22 rises. This in turn causes the emitter current of transistor 22 to rise, which increases the voltage drops across resistor 64 and the resistance network in the emitter circuit of transistor 22.

The increasing voltage drop across resistor 64 causes a decrease in the base input voltage of transistor 26. As the control means resistance continues in increase, it causes a further decrease in the base voltage of transistor 26, and eventually a point is reached where transistor 26 begins to come out of saturation. The emitter current of transistor 26 starts to decrease as it comes out of saturation, and consequently the emitter voltage of transistor 26 begins to drop. A critical point is reached where this action becomes regenerative, and the circuit switches rapidly to the condition where transistor 26 becomes reversely biased and no current flows through the collector load of transistor 26. The circuit will maintain this condition until the control means resistance is again reduced, as already described.

The differential between turn-on and turn-off is determined by the collector loads of transistors 22 and 26 and their emitter circuit resistances. Various amounts of differential can be obtained by suitable proportioning of the collector loads and the emitter circuit resistances, as by varying resistor 30.

The effects of a variation in the Beta of transistors 18 and 22 resulting from changes in the operating temperature will be substantially reduced because of the self-compensating action of the opposite polarity of the complementary transistors. For example, a decrease in the base-to-emitter voltage of transistor 18 resulting from an increase in temperature is offset by a similar but opposite polarity change in the base-to-emitter voltage of transistor 22. The degree of self-compensation, of course, is dependent upon the selection of transistor types having characteristics which are essentially similar over a wide range of temperatures, but of opposite polarity. It is to be understood, of course, the transistors 22 and 26 could be NPN and transistor 18 could be PNP, so long as the circuit is modified accordingly.

Compensation networks formed by thermistor 50, resistor 49, and resistor 48 in the emitter circuit of transistor 22, and thermistor 32, resistor 31, and resistor 30 between the emitters of transistors 22 and 26 are desirable when the collector load of transistor 26 is a relay coil such as that of relay 36 or the like, which changes resistance as the operating temperature is varied. It is to be understood that various compensation network configurations may be used to offset the characteristics of different temperature-sensitive components, and in some cases compensation may not be necessary.

In the embodiment shown in FIGURE 1, where the control means is photoconductive cell 12, which operates as a light-dependent resistor, and the collector load of transistor 26 is a relay coil, it has been found advantageous to use a potentiometer 14 which has a special taper curve, as shown in FIGURE 2. The useful adjustment range of curve 72 is spread over 75 percent of the total rotation of the potentiometer, and the remaining 25 percent of rotation is used to effect relay de-energizing control beyond the range of resistance normally used.

The light-dependent resistor is utilized to operate at two predetermined light intensities, namely 35 foot-candles for relay drop-out, and 58 foot-candles for relay pull-in. Other light intensity ranges may be accommodated by changing the values of certain components in the circuit. The light filter 74 shown in front of the photoconductive cell 12 has a response curve that provides maximum response in the blue region of the light spectrum. Other applications of this device might utilize a variety of filter-response characteristics.

The time-delay network formed by resistor 20 and capacitor 54 is utilized to prevent triggering of the circuit to its relay energized state during periods when the intensity of the light on the photoconductive cell is low enough to hold the relay turned off. This feature is very important if the relay device is used in conjunction with obstruction warning beacons or the like. A desirable characteristic of a time-delay means for such applications is slow response to the increase in light intensity and fast recovery when the light flash is gone. Such a characteristic is provided by the described time delay network, as will be evident from the following description of the delay action.

In this embodiment a capacitance of 100 mfd. and a resistance of 5600 ohms are used in the delay network to provide approximately 5 seconds of time delay. Thus, the elapsed time between illumination of the photoconductive cell by light of several hundred foot-candles intensity and tripping of the circuit to its relay-energized state is approximately 5 seconds, assuming a starting condition of no light on the cell. The delay time will decrease as the starting light intensity is increased, and it will approach zero when the intensity is just below the 35 foot-candle tripping point. The values of these components may be selected to give other time delay intervals.

The action of capacitor 54 may be best understood by assuming a starting condition for which the intensity of the light on the photoconductive cell is sufficient to maintain the circuit in the relay-energized condition. Under this condition the resistance of photoconductive cell 12 will be only a small percentage of the total circuit resistance, and as a consequence, the voltage across capacitor 54 will be quite low. If the light intensity begins to decrease, which in turn causes the resistance of the photoconductive cell to increase, the voltage across capacitor 54 increases. The base input voltage of transistor 18 decreases as the voltage across capacitor 54 increases, and eventually the point is reached where the circuit trips to the relay de-energized state.

At this point the voltage across capacitor 54 is still fairly low, that is, approximately 2 volts, and for this reason the charging to this value takes very little time. The voltage across capacitor 54 continues to rise as the light intensity is further reduced until, under conditions of little or no light, this voltage reaches a maximum which is only a few volts below the total D.C. power supply potential.

Now assume that a bright flash of light, which is of sufficient intensity and duration to reduce the cell resistance to a low value, strikes the photoconductive cell 12. Since the principal discharge path for capacitor 54 is through resistor 20 and the photoconductive cell 12, it will discharge at a rate determined by the combined resistance of the two components. In order to trip to the relay-energized state, the voltage across capacitor 54 must drop below 1.5 volts, and since the capacitor 54 voltage was in the vicinity of 20 volts at the start of the discharge cycle, it will take several seconds for the capacitor voltage to drop to this low value. The resistance of the photoconductive cell rises rapidly when the light flash terminates, and this restoring action prevents capacitor 54 from fully discharging. Repeated high-intensity long-duration flashes of light will eventually cause tripping.

When a relay coil such as that of relay 36 or the like is utilized as the output collector load, it becomes necessary to use negative temperature coefficient (NTC) compensation networks because of the positive temperature coefficient of such components. Suitable networks are included in the circuit of FIGURE 1 in order to maintain stable operating points over a wide temperature range. In order to maintain constant ON-to-OFF differential over a wide temperature range, it is necessary to decrease the resistance between the emitters of transistors 22 and 26 as the relay coil resistance increases as a result of a rise in the operating temperature. For the same reason it is necessary to reduce the resistance in the emitter circuit of transistor 22, as the temperature rises, in order to stabilize the level at which tripping takes place. At the same time, these networks compensate for the change in the D.C. power supply voltage caused by the temperature coefficient of the Zener diode voltage regulator.

There has thus been shown and described a relay circuit having complementary transistors in its input stage and a variable resistance control means, thereby providing several desirable features which cannot be otherwise obtained. The drift of the operating points is considerably reduced because a change in transistor 18 is offset by an opposing change in transistor 22. In addition, transistor 18 inverts the control characteristic and provides high input impedance, simplifying the control circuit.

The control circuit is lightly loaded, because of the high input impedance, and as a consequence, a linear relationship exists between the control means and potentiometer 14, which is the operating-point adjustment control. The control means and the operating-point adjustment control may be interchanged if an inverted control characteristic is desired. In the circuit shown in FIGURE 1, power is applied to the output collector load when the control resistance decreases.

The high input impedance allows a simple time delay network to be used, which, because of the nature of the circuit, yields a desirable response characteristic, namely, slow response to increasing light and fast response to decreasing light.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

I claim:

1. A switching device having in its input stage:

(a) first and second complementary transistors, each having collector, emitter, and control electrodes, said emitter electrode of said first transistor being coupled to said control electrode of said second transistor, (b) a voltage divider network including a resistor connected in series with a photoconductive cell, said resistor including a potentiometer having a taper curve such that the useful adjustment range is spread over a first portion of the total range of said potentiometer, and the remaining portion of the total range can be used to effect de-energizing control of a relay beyond the range of resistance normally used in the circuit, and (c) a time delay network coupling said photoconductive cell to said control electrode of said first transistor, said time-delay network including a resistor and a capacitor coupled to said control electrode of said first transistor and having values such that the response of said switching device is slower for an increase in the amount of radiation incident on said photoconductive cell than for a decrease in the amount of radiation incident thereon, the collector electrode of said second transistor, the emitter electrode of said first transistor, and said resistor of said voltage divider network being coupled to a source of negative direct current, and said emitter electrode of said second transistor, said collector electrode of said first transistor, said capacitor, and said photoconductive cell being coupled to a source of positive direct current.

2. A switching device comprising:

(a) first and second complementary transistors, each having collector, emitter, and control electrodes, said emitter electrode of said first transistor being coupled to said control electrode of said second transistor, (b) a voltage divider network including a resistor connected in series with a photoconductive cell, said resistor including a potentiometer having a taper curve such that the useful adjustment range is spread over a first portion of the total range of said potentiometer, and the remaining portion of the total range can be used to effect de-energizing control of a relay beyond the range of resistance normally used in the circuit, (c) a time delay network coupling said photoconductive cell to said control electrode of said first transistor, said time-delay network including a resistor and a capacitor coupled to said control electrode of said first transistor and having values such that the response of said switching device is slower for an increase in the amount of radiation incident on said photoconductive cell than for a decrease in the amount of radiation incident thereon, the collector electrode of said second transistor, the emitter electrode of said first transistor, and said resistor of said voltage divider network each being coupled to a source of negative direct current, and said emitter electrode of said second transistor, said collector electrode of said first transistor, said capacitor, and said photoconductive cell each being coupled to a source of positive direct current, and (d) a third transistor of the same type as said second transistor and having collector, emitter, and control electrodes, said control electrode of said third transistor being coupled to said collector electrode of said second transistor, said emitter electrode of said third transistor being coupled to said emitter electrode of said second transistor, and said collector electrode of said third transistor being coupled to a load operated by said switching device.

3. A device as defined in claim 2 in which the emitter of said second transistor is coupled to said positive source by a circuit including a thermistor in parallel with a resistor.

4. A device as defined in claim 3 in which said emitters of said second and third transistors are coupled together by means of a second circuit including a thermistor in parallel with a resistor.

5. A device as defined in claim 4, including, in addition, a Zener diode coupled across said negative and positive source.

6. A device as defined in claim 4 in which said resistor of said voltage divider network is a potentiometer having a taper curve such that the useful adjustment range is spread over approximately three-fourths of the total range of the potentiometer, and the remaining approximately one-fourth of the total range can be used to effect relay de-energizing control beyond the range of resistance normally used in the circuit.

7. A switching device comprising:

(a) first and second complementary transistors, each having collector, emitter, and control electrodes, said emitter electrode of said first transistor being coupled to said control electrode of said second transistor, (b) a voltage divider network including potentiometer connected in series with a photoconductor cell, said potentiometer having a taper curve such that the useful adjustment range is spread over approximately three-fourths of the total range of the potentiometer, and the remaining approxmately one-fourth of the total range can be used to effect relay de-energizing control beyond the range of resistance normally used in the circuit, (c) a time delay network coupling said photoconductive cell to said control electrode of said first transistor, said time-delay network including a resistor and a capacitor coupled to said control electrode of said first transistor and having values such that the response of said switching device is slower for an increase in the amount of radiation incident on said photoconductive cell than for a decrease in the amount of radiation incident thereon, (d) a third transistor of the same type as said second transistor and having collector, emitter, and control electrodes, said control electrode of said third transistor being coupled to said collector electrode of said second transistor through a second resistor, and said emitter electrode of said third transistor being coupled to said emitter electrode of said second transistor by means of a circuit including a thermistor in parallel with a third resistor, (e) a source of positive direct current coupled to said emitter of said second transistor by means of a second circuit including a second thermistor in parallel with a fourth resistor, to said control electrode of said third transistor through a fifth resistor, to said collector electrode of said first transistor, to said capacitor, and to said photoconductive cell, and (f) a source of negative direct current coupled to said potentiometer, to said emitter of said first transistor through a sixth resistor, to said collector of said second transistor through a seventh resistor, and to said collector of said third transistor through a coil of a relay.

8. A device as defined in claim 7, including, in addition, a Zener diode coupled across said negative and positive sources.

9. A switching device having in its input stage:

(a) first and second complementary transistors, each having a control electrode, said first transistor being coupled to said control electrode of said second transistor, (b) a voltage divider network including a potentiometer connected in series with control means having a resistance that varies with the amount of radiation incident thereon, said potentiometer having a taper curve such that the useful adjustment range is spread over a first portion of the total range of said potentiometer, and the remaining portion of the total range can be used to effect de-energizing control beyond the range of resistance normally used in the circuit, and (c) a time-delay network coupling said control means to said control electrode of said first transistor, said time-delay network including a resistor and a capacitor coupled to said control electrode of said first transistor and having values such that the response of said switching device is slower for an increase in the amount of radiation incident on said control means than for a decrease in the amount of radiation incident thereon, said first and second transistors potentiometer, capacitor and control means each being coupled to a source of direct current.

10. Apparatus as defined in claim 9 in which said first portion is a majority of said total range.

11. A switching device having in its input stage:

(a) first and second complementary transistors, each having a control electrode, said first transistor being coupled to said control electrode of said second transistor, (b) a voltage divider network including a resistor connected in series with control means having a resistance that varies with the amount of radiation incident thereon, and (c) a time-delay network coupling said control means to said control electrode of said first transistor, said time-delay network including a resistor and a capacitor coupled to said control electrode of said first transistor, said resistor being coupled in series with said voltage divider network and said control electrode of said first transistor, and said time-delay network having values such that the response of said switching device is slower for an increase in the amount of radiation incident on said control means than for a decrease in the amount of radiation incident thereon, said first and second transistors, resistor of said voltage divider network, capacitor and control means each being coupled to a source of direct current.

References Cited by the Examiner

UNITED STATES PATENTS

| | | | |
|---|---|---|---|
| 2,060,114 | 11/1936 | Podolsky | 338—142 |
| 2,859,405 | 11/1958 | Feldman et al. | 330—17 |
| 2,863,957 | 12/1958 | Hamilton | 330—23 |
| 2,901,669 | 8/1959 | Coleman | 307—88.5 |
| 2,902,674 | 9/1959 | Billings et al. | 307—88.5 |
| 2,956,179 | 10/1960 | Yragui | 317—148.5 |
| 2,971,134 | 2/1961 | Cockrell | 307—88.5 |
| 3,060,331 | 10/1962 | Habisohn | 307—88.5 |
| 3,069,552 | 12/1962 | Thompson | 307—88.5 |

OTHER REFERENCES

Army (Technical Manual TM11–690), Basic Theory and Application of Transistors, 3–1959, pages 90, 91 and 98.

JOHN W. HUCKERT, *Primary Examiner.*

DAVID J. GALVIN, *Examiner.*

B. P. DAVIS, *Assistant Examiner.*